(12) United States Patent
Kawamoto et al.

(10) Patent No.: US 7,830,711 B2
(45) Date of Patent: *Nov. 9, 2010

(54) MEMORY SYSTEM AND DATA WRITING METHOD

(75) Inventors: Kazuya Kawamoto, Sagamihara (JP);
Yoshiyuki Tanaka, Yokohama (JP);
Hiroshi Sukegawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/483,275

(22) Filed: Jun. 12, 2009

(65) Prior Publication Data

US 2009/0244974 A1 Oct. 1, 2009

Related U.S. Application Data

(63) Continuation of application No. 11/846,334, filed on Aug. 28, 2007, now Pat. No. 7,558,113, which is a continuation of application No. 11/193,433, filed on Aug. 1, 2005, now Pat. No. 7,376,012.

(30) Foreign Application Priority Data

Aug. 2, 2004 (JP) .............................. 2004-225026

(51) Int. Cl.
*G11C 16/04* (2006.01)
(52) U.S. Cl. ............................ 365/185.09; 365/185.17; 365/185.22
(58) Field of Classification Search ............ 365/185.17, 365/185.09, 185.22, 185.23, 185.33, 200
See application file for complete search history.

(56) References Cited

U.S. PATENT DOCUMENTS

| | | | |
|---|---|---|---|
| 6,185,134 B1 | 2/2001 | Tanaka | |
| 6,339,546 B1 | 1/2002 | Katayama et al. | |
| 6,510,537 B1 | 1/2003 | Lee | |
| 6,549,459 B2 | 4/2003 | Higuchi | |
| 6,646,930 B2 | 11/2003 | Takeuchi et al. | |
| 6,788,596 B2* | 9/2004 | Kim et al. | 365/200 |
| 7,177,199 B2 | 2/2007 | Chen et al. | |
| 7,317,636 B2* | 1/2008 | Ide et al. | 365/185.22 |
| 7,376,012 B2 | 5/2008 | Kawamoto et al. | |
| 7,415,641 B1* | 8/2008 | Behera et al. | 714/711 |
| 7,434,111 B2 | 10/2008 | Sugiura et al. | |
| 7,558,113 B2* | 7/2009 | Kawamoto et al. | 365/185.17 |
| 7,646,655 B2* | 1/2010 | Mondello et al. | 365/201 |
| 2006/0109715 A1 | 5/2006 | Lee et al. | |
| 2006/0224789 A1 | 10/2006 | Cho et al. | |

FOREIGN PATENT DOCUMENTS

JP 7-29392 1/1995

(Continued)

*Primary Examiner*—Gene N. Auduong
(74) *Attorney, Agent, or Firm*—Oblon, Spivak, McClelland, Maier & Neustadt, L.L.P.

(57) ABSTRACT

A data writing method is disclosed. In a memory system comprising a NAND flash memory and a controller which controls the memory, the memory system storing data provided from a host to the NAND flash memory, the data writing method comprises a steps of specifying a column address in which a column failure which has occurred in the NAND flash memory by the controller, and a step of, during writing into the NAND flash memory, writing data of a first logic level into a memory cell which corresponds to the specified column address regardless of write data provided from the controller.

9 Claims, 9 Drawing Sheets

FOREIGN PATENT DOCUMENTS

| | | |
|---|---|---|
| JP | 8-315590 | 11/1996 |
| JP | 2000-173289 | 6/2000 |
| JP | 2001-250395 | 9/2001 |
| JP | 2002-117692 | 4/2002 |
| JP | 2002-117699 | 4/2002 |
| JP | 2003-281900 | 10/2003 |
| JP | 2004-39112 | 2/2004 |
| JP | 2004-182865 | 7/2004 |

* cited by examiner

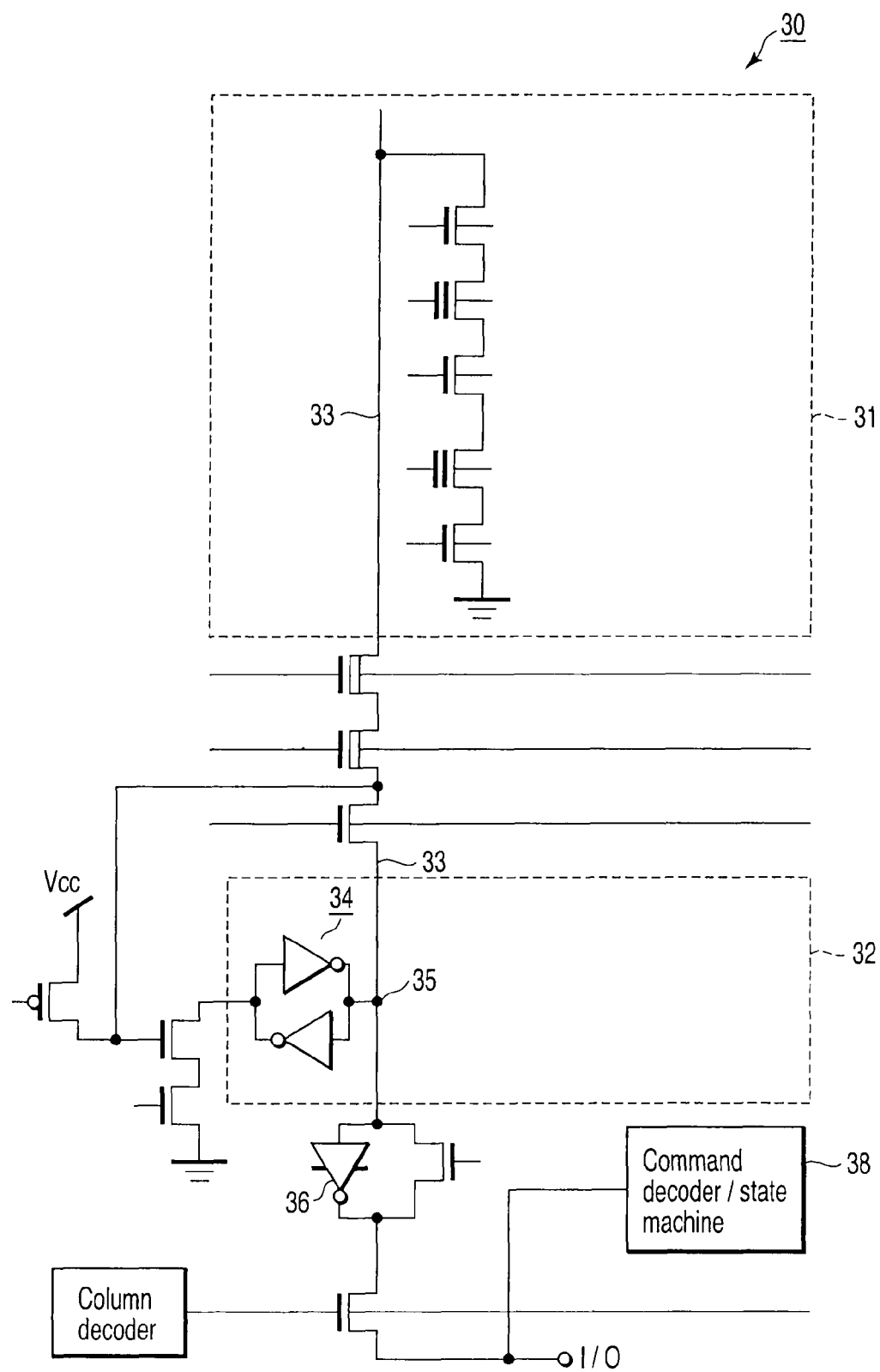
F I G. 4

MEMORY SYSTEM AND DATA WRITING METHOD

CROSS-REFERENCE TO RELATED APPLICATIONS

This application is a Continuation of U.S. application Ser. No. 11/846,334, filed Aug. 28, 2007, which is a continuation of U.S. application Ser. No. 11/193,433, filed Aug. 1, 2005, now U.S. Pat. No. 7,376,012, issued May 20, 2008. This application is based upon and claims the benefit of priority under 35 U.S.C. §119 from Japanese Patent Application No. 2004-225026 filed Aug. 2, 2004. The entire contents of each of these documents are incorporated herein by reference.

BACKGROUND OF THE INVENTION

1. Field of the Invention

The present invention relates to a memory system and a data writing method utilizing the memory system, and more particularly, to measures against a bit line failure of a nonvolatile semiconductor memory.

2. Description of the Related Art

In a nonvolatile semiconductor memory such as a NAND type flash memory, cell failure may occur before or after shipment of the memory. Such nonvolatile semiconductor memory, which may include cell failure, may be still utilized as storage devices by way of control of a controller. The controller controls the nonvolatile semiconductor memory on block-by-block basis, the block serving as an erasure unit when data is rewritten in the nonvolatile semiconductor memory. Refer to, for example, Jpn. Pat. Appln. KOKAI Publication No. 7-29392. However, with the trend of large scale integration and miniaturization of the nonvolatile flash memory, there have been substantiated not only the above-described failure controllable in block-by-block basis but also another failure called a "column failure". The column failure gives undesirable influence on a plurality of blocks sharing the same bit line. Thus, it is impossible to manage such a column failure by way of block-by-block basis.

In the case where a memory cell array is managed on a block-by-block basis, when a write failure or an erasure failure is detected in a block serving as a write object or erasure object, a reserved block is used in place of the faulty block. However, when a column failure occurs, there may exist a write failure or an erasure failure in not only a block but also its reserved block, since these blocks generally share a bit line. When such a column failure occurs before shipment of a nonvolatile semiconductor memory product, it is possible to take measures by using a technique called column redundancy to program a decoder circuit so as to replace the faulty column with a redundancy column. Refer to, for example, Jpn. Pat. Appln. KOKAI Publication No. 2002-117692. However, when the column failure occurs after shipment of the nonvolatile semiconductor memory, it is impossible to carry out measures by using the column redundancy technique. In addition, in a system including the nonvolatile semiconductor memory and controller, even when a write error or an erasure error is detected in the nonvolatile semiconductor memory by the controller, the controller cannot detect whether or not such error is caused by the column failure.

BRIEF SUMMARY OF THE INVENTION

According to an aspect of the present invention, there is provided, in a memory system comprising a NAND flash memory and a controller which controls the NAND flash memory, in which data inputted from a host is stored in the NAND flash memory, a data writing method comprising:

specifying a column address of a column of the NAND flash memory, in which a column failure has occurred, by the controller; and writing data of a first logic level to a memory cell which corresponds to a specified column address in writing to the NAND flash memory, regardless of data inputted from the controller.

According to another aspect of the present invention, there is provided a memory system comprising:

a memory cell array to which data is written on a page-by-page basis;

a page buffer which holds data for one page written into the memory cell array;

an input terminal which receives write data from the outside; and a mask circuit connected to the input terminal and the page buffer, the mask circuit masking part of the write data received by the input terminal, wherein, in the case where an electric charge is not injected in a memory cell of the memory cell array, a latch circuit of the page buffer corresponding to the memory cell holds a first logic level, and the mask circuit masks part of the write data by a signal of the first logic level.

According to still another aspect of the present invention, there is provided a memory system comprising:

a NAND flash memory including a memory cell array and a page buffer which holds data to be stored in the memory cell array or data read from the memory cell array, wherein the memory cell array has a data storage region in which inputted user data is stored and an expected value storage region in which data of a predetermined pattern is stored in advance, and data storage region and the expected value storage region share a bit line, and a controller which reads data from the expected value storage region and compare the read data with the predetermined pattern.

BRIEF DESCRIPTION OF THE SEVERAL VIEWS OF THE DRAWING

FIG. 4 is a circuit diagram of a NAND flash memory card in accordance with a third embodiment of the present invention;

DETAILED DESCRIPTION OF THE INVENTION

Hereinafter, embodiments of the present invention will be described with reference to the accompanying drawings.

First Embodiment

Figure 1:
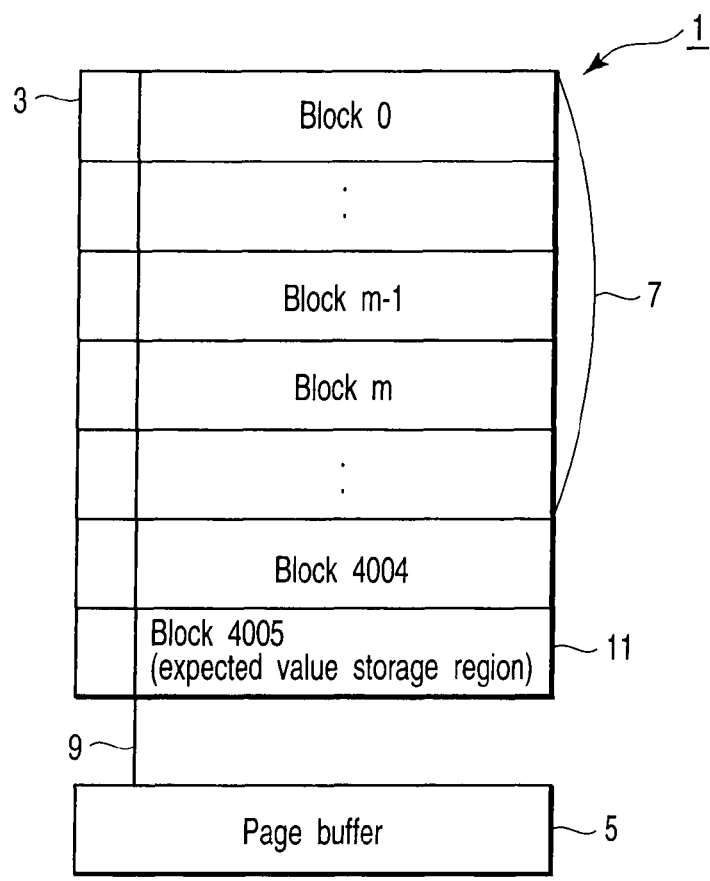
FIG. 1 is a block diagram depicting an example of a configuration of a NAND flash memory in accordance with a first embodiment of the present invention.

FIG. 1 is a block diagram depicting an example of a configuration of a NAND flash memory in accordance with a first embodiment of the present invention. As shown in FIG. 1, a NAND flash memory 1 has, a memory cell array 3, and a page buffer 5 which holds data to be stored in the memory cell array or data read from the memory cell array. The memory cell array 3 has: a data storage region 7 which stores user data to be inputted; and an expected value storage region 11 which shares a bit line 9 with the data storage region 7, but which is not used to store the user data. The memory cell array includes a plurality of blocks. Individual blocks include a plurality of pages. Data on predetermined patterns are stored in advance in the expected value storage region 11 before a column failure occurs, thereby making it possible to detect a column failure while the data on these predetermined patterns are defined as an expected value. In the case where the column failure exists, the data actually read from the expected value storage region 11 does not match the above-described predetermined pattern stored in advance.

In the case where an error has been detected when the user data is written into the data storage region 7, the error is assumed to be an error caused by a failure of a specific memory cell included in a page targeted for writing, an error caused by a failure of a block, or an error caused by a failure of a bit line which extends to a memory cell array (column failure). In this case, data is read from the expected value storage region, and if the thus read data does not match a predetermined pattern, it can be judged that a column failure has occurred.

The column failure includes a bit line leakage featured in that a memory cell transistor is as if it were always electrically conductive and a bit line open featured in that a memory cell transistor is as if it were always electrically nonconductive. In the case where a column failure is due to the bit line leakage, data read from a memory cell in which the column failure occurs is "1". On the other hand, in the case where a column failure is due to the bit line open, data read from a memory cell in which the column failure occurs is "0". Thus, as a predetermined pattern of data serving as an expected value, "0000 . . . 00" (namely, "0" is set to all bits on one page) is used to detect the bit line leakage, whereas "FFFF . . . FF" (namely, "1" is set to all bits) is used to detect the bit line open. For example, in the case where only the bit line leakage is likely to occur for a reason relevant to a process of manufacturing the nonvolatile semiconductor memory, "0000 . . . 00" may be stored as pattern data in the expected value storage region. In addition, in the case where only the bit line open is likely to occur, "FFFF . . . FF" may be stored as predetermined pattern data in the expected value storage region. In the case where both of the bit line leakage state and the bit line open state may occur, for example, "0000 . . . 00" and "FFFF . . . FF" are stored as expected values in an even numbered page and an odd numbered page, respectively.

For example, in the case where a bit line open occurs with a bit line which falls into the beginning of a page, the read data is actually "7FFF . . . FF", although it should be "FFFF . . . FF". This state is detected in a plurality of pages of the expected value storage region 11, thus making it possible to assume that a column failure has occurred.

In this way, in the NAND flash memory according to the present invention, a different data from that read when a column failure occurs is stored as an expected value in an expected value storage region. Thus, when an error is detected at writing of user data, a column failure can be detected by reading data from the expected value storage region having a bit line shared with a memory cell in which the error is detected.

In order to increase the precision of column failure detection, it is possible to assign a plurality of blocks to the expected value storage region 11. If the data read from pages in different blocks each does not match a predetermined pattern stored in the expected value storage region, it indicates that a column failure occurs instead of indicating a failure caused by a specific block.

Second Embodiment

The present embodiment describes a method of detecting the presence or absence of a column failure by utilizing a general read command (for example, 00h) which a NAND flash memory comprises in the above-described NAND flash memory having the expected value storage region.

Figure 2:
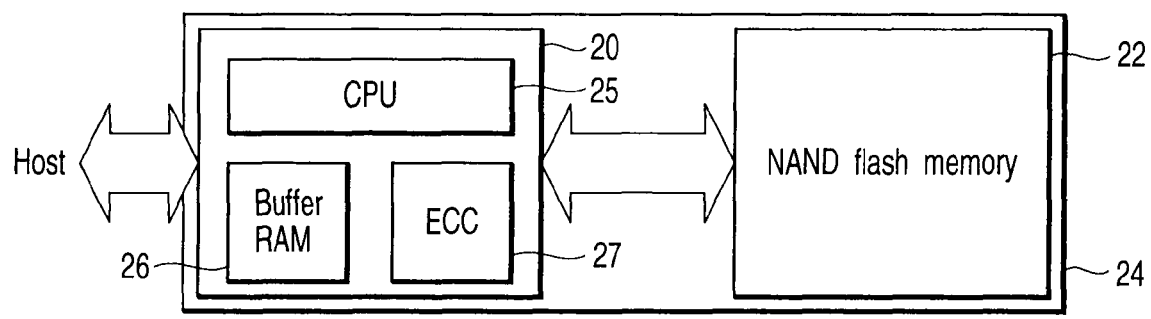
FIG. 2 is a block diagram of a storage system in accordance with a second embodiment of the present invention.

FIG. 2 shows a storage system which includes a controller 20 and a NAND flash memory 22. The controller 20 comprises a CPU 25, a buffer RAM 26 which temporarily stores data received from a host, and an error checking & correction (ECC) circuit 27. The controller 20 comprises the ECC circuit 27, thus making it possible to specify a column address in which a column failure occurs within the range of the correction capability of the ECC circuit 27 by reading data contained in a page by utilizing a general read command (for example, 00h) which the NAND flash memory provides after an error has been detected in an operation for writing data into such a page contained in a block of the NAND flash memory 22. Similarly, it is possible to specify a column address in which a failure occurs also in the case where an ECC error has been detected in an operation for reading data from a page in a block.

In addition, the column address specified by reading data contained in the expected value storage region is compared with the column address specified in a data storage region by utilizing the general read command and ECC circuit 27. When these column addresses match each other, it can be said that a column failure occurs.

Figure 3:
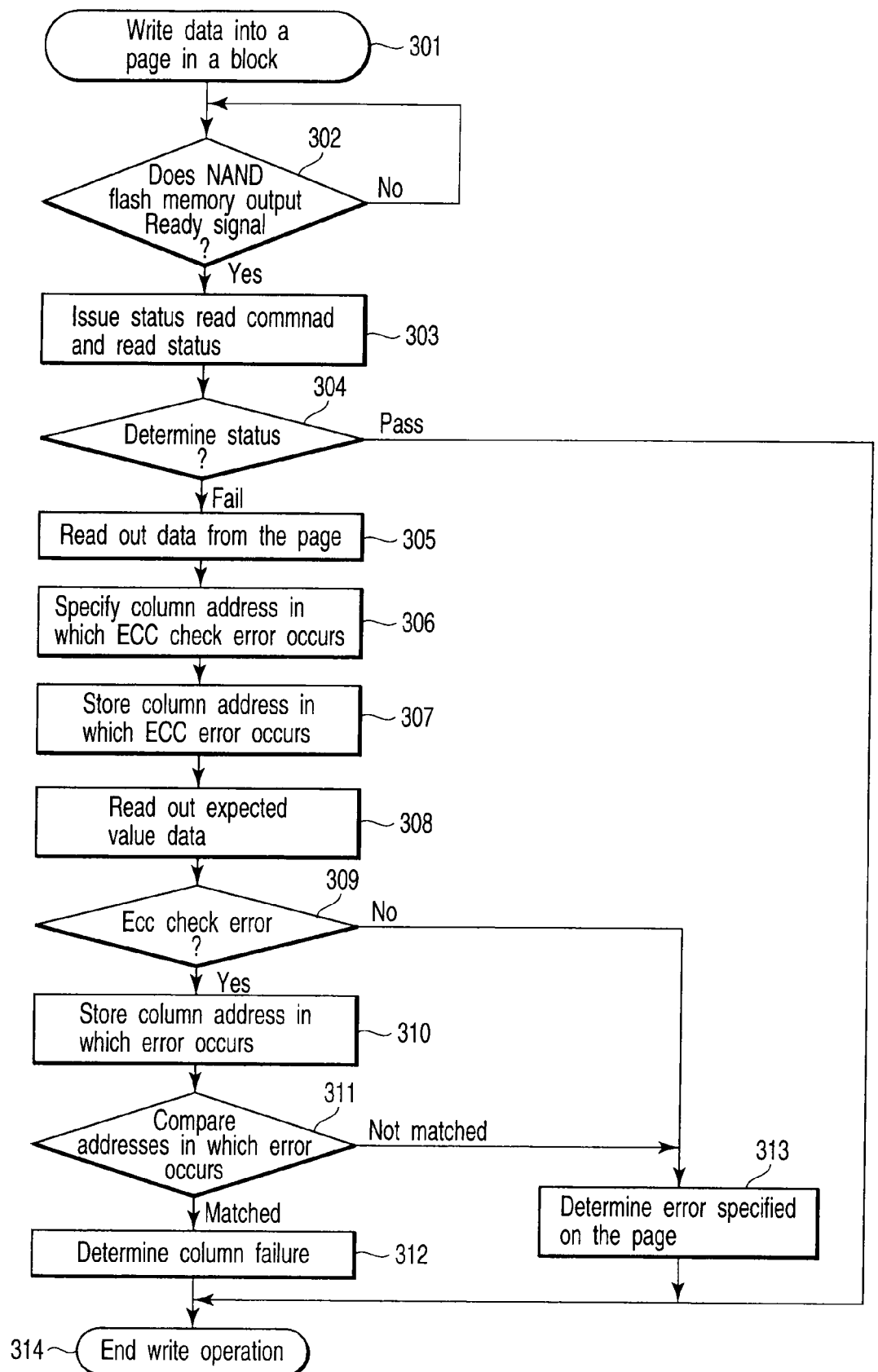
FIG. 3 is a flowchart showing procedures for detecting a column failure in accordance with the second embodiment.

FIG. 3 is a flowchart showing procedures for detecting a column failure described above. First, the controller inputs a data input command (for example, 00h), an address, data, and a program commands (for example, 10h) via an I/O terminal to the NAND flash memory, and starts data writing into a page contained in a block of the NAND flash memory (S301). Next, the controller monitors a signal outputted to a Ready/Busy# terminal of the NAND flash memory until the NAND flash memory has outputted a Ready signal (S302). When the Ready signal is detected, the controller issues a status read command (for example, 70h) to the NAND flash memory via the I/O terminal, and reads a write status relevant to the NAND flash memory from the I/O terminal of the NAND flash memory (S303). Next, the controller makes a status determination (S304). When the status is "Pass", the controller terminates the write processing (S314). When the status is "Fail", the controller reads data from the page on which the write processing has been carried out (S305). Next, the controller makes a check using an ECC circuit on the read data, and specifies a column address in which an error occurs (S306). Next, the controller stores the specified column address in an internal register (S307). Next, the controller reads data from the expected value storage region of the NAND flash memory (S308). Next, the controller makes a check using the ECC circuit on the data read from the expected value storage region (S309), and determines that, if no ECC error is detected, the write error occurs on only a specific page (S313). In the case where the ECC error has been detected, the controller stores the column address in which the error occurs in the internal register (S310). Next, the controller compares the column addresses stored in the above steps S307 and S310 (S311), and if these addresses do not match each other, the controller determines that the write error occurs on only a specific page (S313). When the column addresses match each other, the controller determines that the write error occurs due to a column failure (S312).

When the write error has been detected, the controller 20 can specify a column address in which a failure occurs without using the ECC circuit 27. This is because the controller holds in its internal buffer RAM 26 the data to be written into the NAND flash memory 22. The controller 20 reads data by a general read operation from a region of a page address (row address) in which the write error has occurred in the NAND flash memory after the write error has been detected. Then, the controller can specify the column address in which the write error has occurred by comparing the data held in the buffer RAM 26 with the data read from a region of the page address. With this technique, even if the number of bits with which a write error occurs exceeds the correction capability of the ECC circuit 27, it is possible to detect the write error. When the detected column address matches a column address specified by utilizing the expected value storage region described previously, it becomes possible to detect a column failure.

Third Embodiment

A NAND flash memory in the present embodiment itself comprises a function for detecting a bit line leakage or a bit line open.

As shown in FIG. 4, a NAND flash memory 30 has a memory cell array 31, and a page buffer 32 which holds data to be stored in this memory cell array or data read from the memory cell array 31. The page buffer 32 includes a latch circuit 34 connected to a bit line 33. In FIG. 4, although only one bit line 33 and one latch circuit 34 are described, an actual NAND flash memory includes a plurality of bit lines and latch circuits corresponding to a page length of the memory cell array 31. In the following description, the latch circuit 34 holding "1" denotes that a node 35 connected to a bit line of the latch circuit 34 indicates "1". Data contained in the latch circuit 34 is read from an I/O terminal 37 via a clocked inverter 36.

In the present embodiment, the NAND flash memory 30 is compatible with a read command for column failure detection which is different from a general read command (00h). When this read command for column failure detection is entered, a command decoder and state machine 38 controls the memory cell array 31, and an electrical potential is applied to control gates of these memory cells, such that all of the memory cells enter a forced conductive state or a nonconductive state. Then, the data according to the electrical potential of the bit line 33 is captured by the latch circuit 34 configuring the page buffer 32 of the NAND flash memory 30. In the case where all the blocks contained in the memory array 30 enter a selected state and in the case where all the memory cells enter the forced conductive state, the node 35 at the bit line side of the latch circuit 34 configuring the page buffer 32 indicates "1" if a bit line open failure occurs with the bit line 33. In the case where all the memory cells enter the forced conductive state, however, the note at the bit line side of the latch circuit 34 indicates "0" if no bit line open failure occurs. In addition, in the case where all the blocks contained in the memory array 31 enter the deselected state, the node 35 at the bit line side of the latch circuit 34 indicates "0" if a bit line leakage failure occurs with the bit line 33. In the case where all the blocks contained in the memory array 31 enter the deselected state, however, the node 35 at the bit line side of the latch circuit 34 indicates "1" if no bit line leakage failure occurs.

Figure 5:
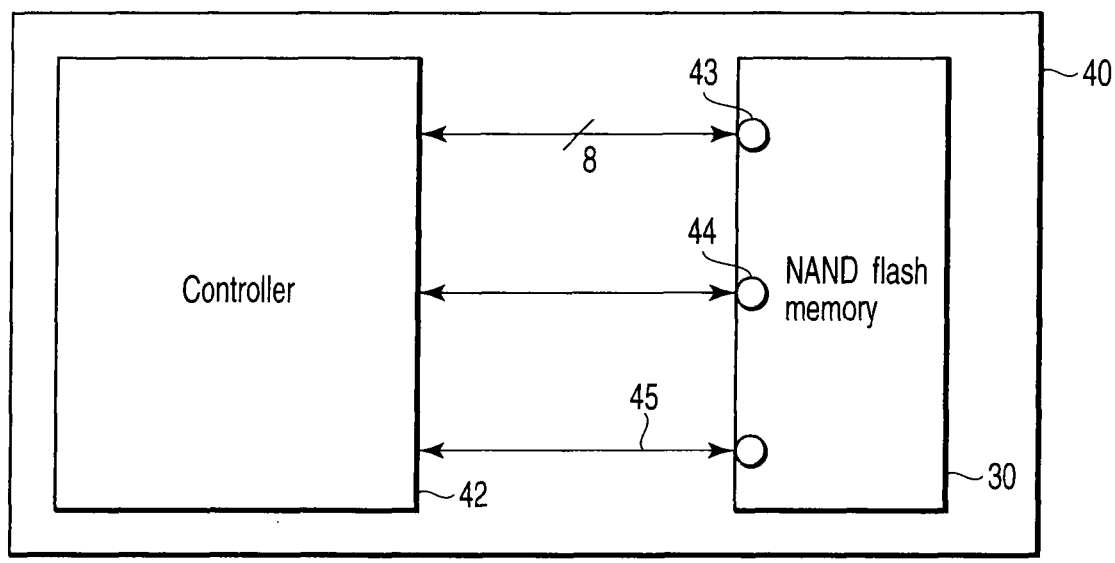
FIG. 5 is a block diagram of a memory card in accordance with the third embodiment.

FIG. 5 is a block diagram of a memory card 40 which includes such a NAND flash memory 30 and a controller 42 which controls the memory. Reference is made to FIG. 4 for a detailed configuration of the NAND flash memory 30. In such a memory card 40, the controller 42 inputs the above-described command for column failure detection from an I/O terminal 43 to the NAND flash memory 30. This command is provided as a command for bit line open detection which causes all blocks to enter a selected state and establishes all memory cells in the forced conductive state (for example, AAh) or a command for bit line leakage detection which causes all the blocks contained in the memory array to enter the deselected state (for example, ABh). The NAND flash memory 30 enters a column failure detecting operation upon the receipt of this command, and a Busy state is outputted to a Ready/Busy# terminal 44. When the column failure detecting operation terminates in the NAND flash memory 30, a Ready state is outputted to the Ready/Busy# signal terminal 44. In response to this Ready state, the controller clocks an RE# signal provided to an RE# terminal 45 and reads the contents of a page buffer contained in the NAND flash memory 30. In addition to the above, although signals such as a power supply Vdd/Vss, an address latch enable ALE, a command latch enable CLE, and a chip enable CE# are provided from the controller 42 to the NAND flash memory 30, these signals are omitted in FIG. 5. For example, in the case where a bit line enters an open state, an electrical potential of that bit line during reading should be always detected as "1", and, as a result of entering a command for bit line open detection, "0" should be detected in the data read from the page buffer. This is because the data held in the latch circuit 34 is read after being inverted by means of the clocked inverter 36.

In general, data is written into the NAND flash memory 30 in order of data input command entry (for example, 80h), address input, write data input, and write command entry (for example, 10h). The inputted data is first stored in the page buffer 32, and is programmed to the memory cell array 31 in response to write command entry. A verifying operation is carried out on a bit by bit basis during programming, and "1" is set to the latch circuit 34 of the page buffer 32 from a column in which programming has completed. Programming is carried out again for a memory cell of a column in which "0" is set to the latch circuit 34. If all the bits on the page buffer are set "1" in a predetermined write count, it implies that a write operation has normally completed. On the other hand, if "0" more than at least 1 bit exists, it implies that the write operation has normally completed. In the NAND flash memory 30, it is determined whether or not the write operation has normally completed according to whether or not all the bits of the page buffer 32 are thus set to "1".

The controller 42 senses that a signal outputted to the Ready/Busy# terminal 44 of the NAND flash memory 30 has entered the Ready state, whereby the write operation has completed. When the controller 42 senses that the write operation has completed, the controller determines that the write operation has normally completed by using a state read command (for example, 70h). In the case where a write error has been detected at this stage, the controller determines whether or not a bit line leakage failure occurs by utilizing the bit line leakage detecting command.

Figure 6:
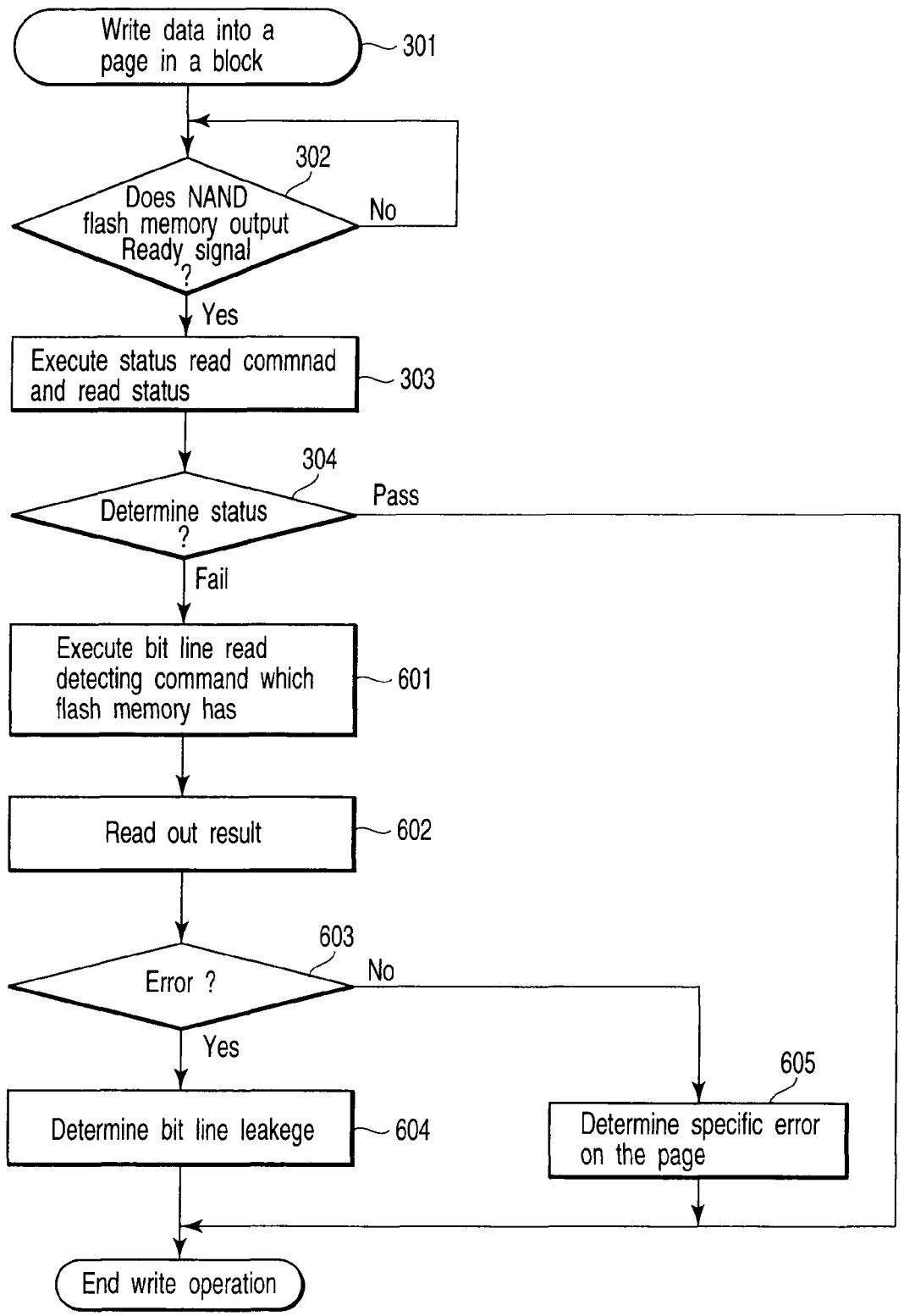
FIG. 6 is a flowchart showing procedures for detecting a column failure in accordance with the third embodiment.

FIG. 6 is a flowchart illustrating this method. Like processes in FIG. 6 are designated by like reference numerals, and a duplicate description is omitted here. When "Fail" is detected in status determination after writing into a page, the controller issues a bit line leakage detecting command to the NAND flash memory (S601). Next, the controller reads a bit line leakage detection result from the NAND flash memory (S602). When the controller detects a bit line leakage, the page write error is determined to be caused by a bit line leakage (S604). In the case where no bit line leakage failure is detected, the controller determines that the write error is specific to the page (S605). A process for detecting the column failure may be executed after an error has been detected during data read or erasure as well as immediately after the write error has occurred. Alternatively, this detecting process may be executed immediately after starting up a memory card or a host system or immediately before terminating it.

An example of a configuration of the memory cell array 31 in the NAND flash memory 30 will be described in detail. The memory cell array 31 is, in its page length, any of 528 bytes (data portion 512 bytes+redundancy portion 16 bytes); 2112 bytes (data portion 2048 bytes+redundancy portion 64 bytes); and 4224 bytes (data portion 4096 bytes+redundancy portion 128 bytes). The redundancy portion used here is different from a redundancy portion composed of a reserved bit line for use in column redundancy before shipment. In the case where an 8-bit array (so called X8) configuration is provided, a page length per I/O is 528 bits, 2112 bits, or 4224 bits. The memory cell array 31 includes a plurality of blocks, and one block becomes a unit during erasure. One block includes, for example, 64 pages. It is possible to associate a write/read circuit for the memory cell 31 with two values or four values. An example of a configuration of the memory cell array described here can be applied to a NAND flash memory according to another embodiment without being limited to the present embodiment.

Fourth Embodiment

Figure 7:
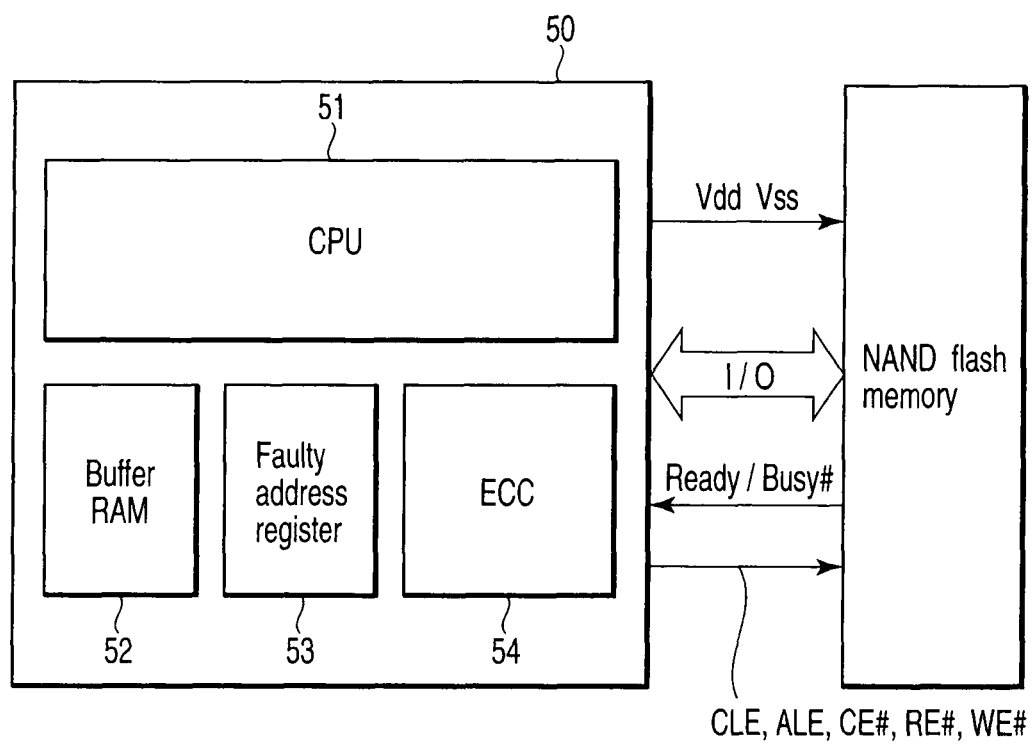
FIG. 7 is a block diagram of a memory card in accordance with a fourth embodiment of the present invention.

Referring to FIG. 7, a description will be given with respect to a technique for specifying a column address in which a bit line leakage failure occurs in a NAND flash memory capable of reading contents of a page buffer as they are without resetting them after a write operation has completed.

A controller 50 comprises a CPU 51, a buffer RAM 52, a faulty address register 53, and an ECC circuit 54. The controller is connected to a NAND flash memory via a signal line such as I/O, Vdd, Vss, Ready/Busy#, command latch enable CLE, address latch enable ALE, chip enable CE#, read enable RE#, and write enable WE#.

In order to detect a bit line leakage, the controller 50 first makes an operation for writing data on all "0"s into a page of a block. Then, after the write operation has been completed, the contents of the page buffer are read as they are without resetting them. For this purpose, the controller inputs a register read command (for example, E0h) to the NAND flash memory via the signal line I/O. After this command has been captured by the NAND flash memory in response to the write enable WE# signal, the address latch enable ALE signal is established in a deselected state and the RE# signal is clocked, thereby making it possible to read the data contained in the page buffer without resetting the contents of the page buffer.

If the write operation has normally completed, all the data contained in the page buffer should be "1". In the case where the write operation has not normally completed, however, part of the data contained in the page buffer is set to "0". By detecting the position of the "0" data, the controller can detect a column in which a write error has occurred. By only this operation, it is impossible to determine whether a failure in a specific cell has occurred or a failure due to a bit line leakage has occurred. The controller stores a faulty column address in the faulty address register 53 incorporated in the controller. The controller again makes an operation for writing data on all "0"s in to a page of a block which is different from the previous block. Then, the controller reads the contents of the page buffer without resetting them after the write operation has completed. If the write operation has normally completed and all the data contained in the page buffer are set to "1", it can be judged that the write error has not occurred due to a column failure. If the write operation has not normally completed and part of the data contained in the page buffer is set to "0", a column address in a failure occurs is specified, and the thus specified column address is compared with a column address stored in the faulty column address register 53. If these addresses match each other, it can be determined that a write error which occurs is caused by a bit line leakage.

Figure 8:
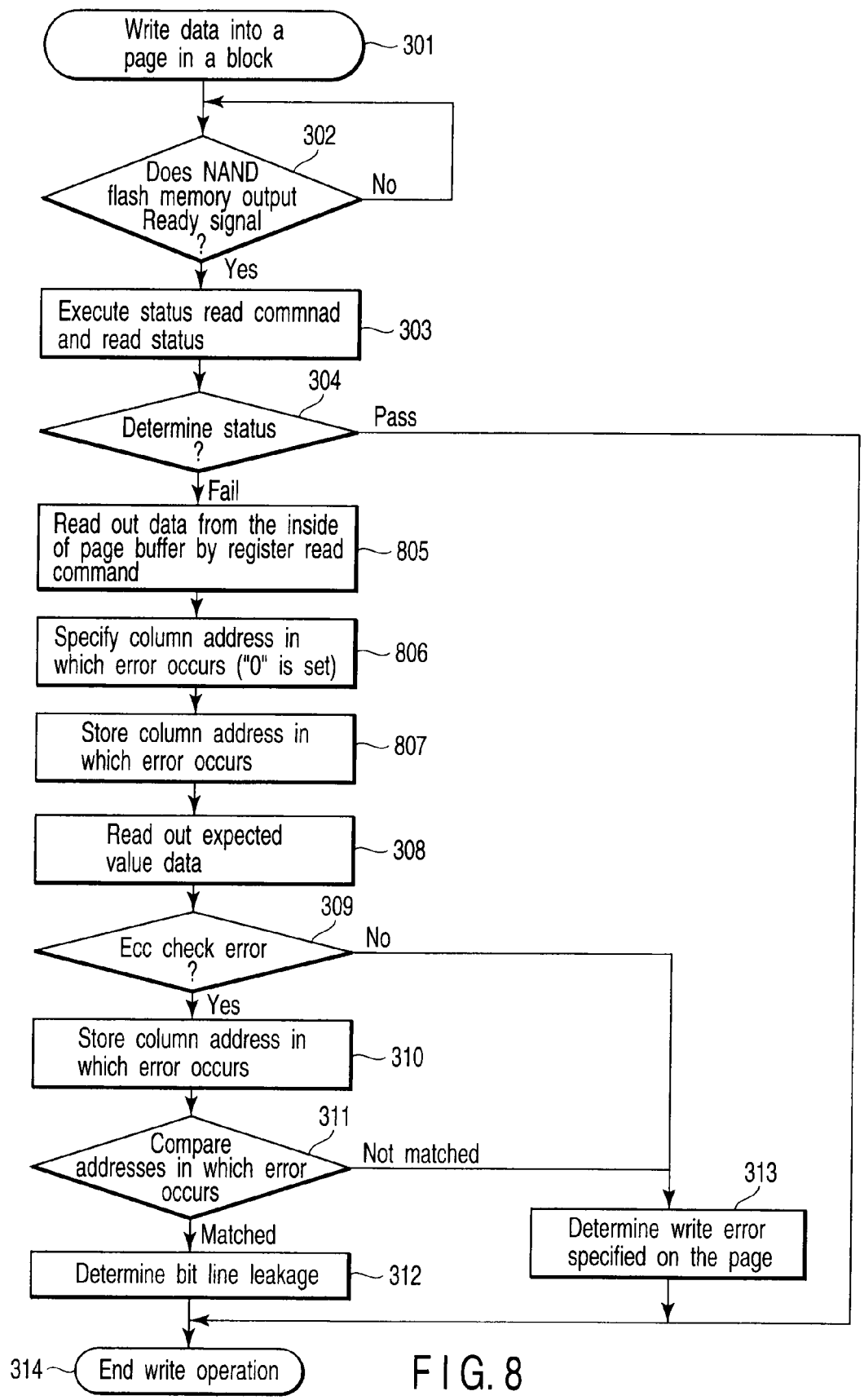
FIG. 8 is a flowchart showing procedures for detecting a column failure in accordance with the fourth embodiment.

Alternatively, it is possible to determine a bit line leakage failure by comparison with the faulty column address specified by data read from the expected value storage region described previously. This method will be described with reference to the flowchart of FIG. 8. Like processes in FIG. 3 are designated by like reference numerals, and a duplicate description will be described here. If Fail is detected by status determination after writing into a page, the controller reads data contained in the page buffer as is by using a resistor read (E0h) command (S805). Next, the controller specifies a bit set to "0" from among the data read from the page buffer, and specifies a column address in which an error occurs (S806). Next, the controller stores this column address in the faulty column address register (S807). Reference is made to a description of FIG. 3 for the remaining processes.

Fifth Embodiment

As described previously, in the case where a controller comprises an ECC circuit, the controller reads the data of the page by utilizing a general read command (for example, 00h) after a failure has been detected in an operation for writing into a page of a block, thereby making it possible to specify a column address in which a failure occurs in the range of the correction capability of the ECC. Similarly, in an operation for reading a page in a block, it is also possible to specify a faulty column address in the case where an ECC error has been detected in the ECC circuit of the controller. However, by only this operation, it is impossible to specify whether a failure is limited to only a page targeted for writing, whether a failure occurs in the same bit line, but is limited to the inside of the block, or a column failure occurs. In contrast, a finding a plurality of column addresses in which a failure occurs are stored, thereby making it possible to estimate that a failure caused by a bit line occurs if a finding that a failure occurs in a common column address is obtained. It is desirable that these items of storage information are information relating to a page or a block address in a wide range connected to the same bit line. However, if a failure occurs at the same column position on each of the pages in at least two or more different blocks, it may be judged that a column failure occurs. A timing of storing these faulty column addresses may be when a faulty column address has been obtained by reading data on the page immediately after a write error has occurred on a page indicated by an address, or alternatively, when faulty column address information is obtained, the information being detected by the ECC circuit during general read operation. In addition, in the case where an erasure failure has been detected for a block, it is possible to store faulty column addresses similarly if a page in the block is read. With respect to storage of these items of storage information, there are proposed: a method of storing information in a RAM of a controller or a faulty address register and making a determination from the information stored only during system operation (during power supply); and a method of storing information in a nonvolatile manner in a region of the NAND-type flash memory in which no failure occurs, and making determination from the information obtained in a system storage operation state.

When a write error has been detected, the controller can specify a column address in which a failure occurs without using an ECC circuit. This is because the controller holds data to be written into the NAND flash memory in its internal buffer RAM. The controller reads data by a general read operation from a region of a page address (row address) contained in a block in which the write error has occurred after write error detection. Then, when the data held in the buffer RAM is compared with the data read from a region of the page address, the controller can specify a column address in which a write error has occurred. This column address is stored in a faulty address register. Next, the operation similar to the above is made for a page of a block which is different from the above. In the case where the obtained two column addresses match each other, it can be judged that a column failure occurs. With this technique, it is possible to carry out detection even in the case where the number of bits with which a write error occurs exceeds the correction capability of the ECC circuit.

Sixth Embodiment

As described previously, all the data contained in the page buffer in the NAND flash memory has been set to "1" during writing, whereby it is judged that the writing operation has normally completed. When, programming, namely, an electric charge is implanted into the memory cell, "0" data is held in a latch circuit which configures the page buffer. Then, a high voltage of about 20 V is applied to a word line (control gate) of a page targeted for the writing operation, whereby an electric charge is implanted into a floating gate of a memory cell in accordance with a tunneling phenomenon. In addition, during a verifying operation, data is read from the memory cell to a latch, whereby, if an electric charge is sufficiently implanted into the floating gate, no electric conductivity is obtained even if a read voltage is applied to a memory cell transistor, and thus, a bit line indicates "1". The bit line electrical potential forcibly inverts a latch circuit, and "1", data is held in the latch circuit. Such a type of circuit is described in FIG. 4 explained previously, and is also disclosed in U.S. Pat. No. 5,726,882. In the case where a bit line leakage failure occurs, however, even if an electric charge is sufficiently implanted into the floating gate, an electrical potential of a bit line is kept to be "0", thus the electric charge implantation into the floating gate is as if it were incomplete.

Thus, in the NAND flash memory, programming and verifying operations are repeated up to the predetermined maximum count.

When the writing operation is started in the NAND flash memory, a signal of a Ready/Busy# terminal which the NAND flash memory has is set to Busy "0" such that a controller connected to the NAND flash memory can detect this state, and the signal is set to Ready ("1") at the same time as when the writing operation completes. In addition, in the NAND flash memory, information indicating whether or not the writing operation has normally terminated is written into a Pass/Fail bit of an internal status register during a Busy period. Thereafter, the controller inputs a status read command (for example, 70h) to an I/O terminal of the NAND flash memory, and determines whether or not the writing operation has been normally completed by the Pass/Fail bit on the status register, the bit being outputted from the NAND flash memory to the I/O terminal. In the case where a bit line leakage occurs, it is possible to finally detect a write error by the status read command. However, the programming count in the NAND flash memory has reached a maximum. Thus, a write speed of the NAND flash memory is lowered, so that the performance of a card or a storage system using the NAND flash memory is lowered. For example, Toshiba 512M bit NAND flash memory TC58512FT presumes that a typical write time tPROG is 200 microseconds. In the case where the programming count has reached the maximum, however, tPROG may be 1000 microseconds.

A bit line failure itself in the NAND flash memory does not occur frequently, thus, making it possible to correct data after an error has occurred by an ECC circuit at the controller side. Therefore, in some systems, it becomes possible to reduce the write error count which the NAND flash memory notifies the controller by providing the NAND flash memory with a pseudo-pass function. The pseudo-pass function used here denotes that, in the case where a programming failure of data on a page has occurred in the NAND flash memory, and if the program failure is within a predetermined allowable bit number, it is considered that programming has normally terminated for all the bits, and the NAND flash memory returns Pass in a pseudo manner to the status read command immediately after the writing operation has completed. Here, it is possible to set the number of faulty bits to be ignored from the controller side to the NAND flash memory. The controller can reduce the frequency of error handling after writing by setting the number of bits to at least one bit or more in accordance with the correction performance of its own ECC circuit. Namely, although an error occurs in the NAND flash memory, the error is within the range of the correction capability of the ECC circuit. Thus, the NAND flash memory does not notify the controller side of the occurrence of the error, thereby making it unnecessary for the controller to execute error handling. After a column failure has been detected by the technique described previously, the controller may change the number of allowable bits in a pseudo-pass operation of the NAND flash memory. For example, the allowable bit number of the pseudo-pass is set to 0 (namely, a state in which no pseudo-pass is allowed). Then, when a bit line leakage failure has been detected with respect to a column, the controller changes to 1 the allowable bit number of the pseudo-pass in the NAND flash memory. This change is made by inputting a pseudo-pass setting command to the NAND flash memory. After the allowable bit number of the pseudo-pass has been changed to 1, the NAND flash memory determines that the writing operation normally terminates even if a bit line leakage failure occurs in one column. Thus, when the controller has read a status register, the write result is obtained as "Pass".

A case in which the allowable bit number of the pseudo-pass is changed from 0 to 1 has been described here. This allowable bit number can be changed according to the capacity of the controller's ECC circuit and a state (frequency) of the occurrence of a failure in the flash memory.

Figure 9:
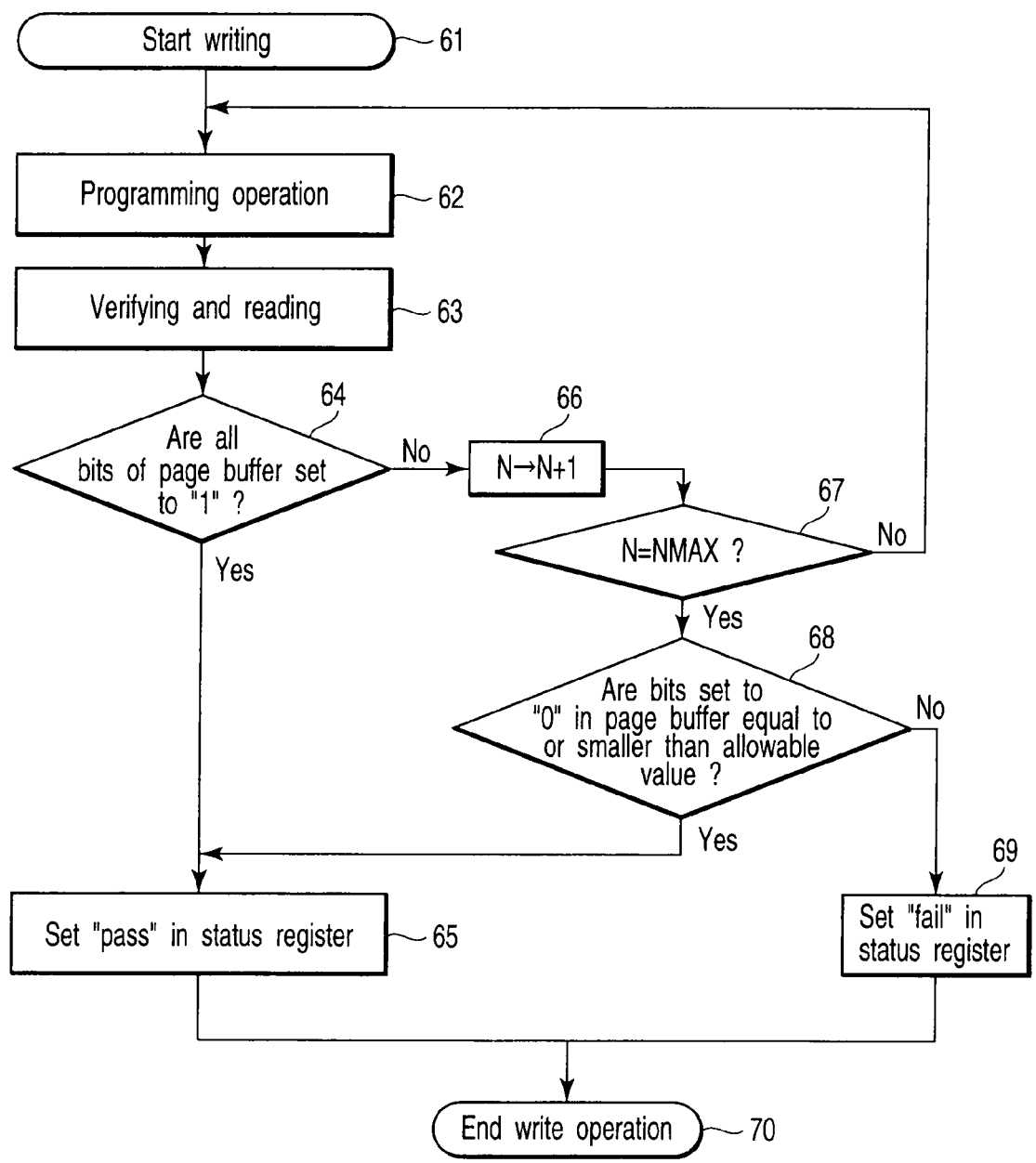
FIG. 9 is a flowchart showing procedures for detecting a write error in accordance with a sixth embodiment of the present invention.

A writing operation and a pseudo-pass operation in the NAND flash memory will be described along the flowchart of FIG. 9. First, in step S61, a writing start operation is started, and a program count counter N is set to 1. Next, in step S62, a programming operation for transferring data from a page buffer to a memory cell array is carried out. Here, a program voltage Vpp of about 20 V is applied to a word line of an actually selected page. Next, in step S63, verify and read operations are carried out. Here, in a latch from among latches configuring the page buffer, the latch corresponding to the memory cell in which an electric charge has been sufficiently implanted, data is inverted from "0" to "1". Next, in step S64, it is determined whether or not all the data contained in the page buffer are set to "1". When the determination result is affirmative, processing goes to step S65. When the determination result is negative, processing goes to step S66. In step S66, the programming count N is incremented by 1. Next, in step S67, it is determined that the programming count N has reached the set maximum value NMAX. If the determination result is negative, processing reverts to step S62. When the determination result is affirmative, processing goes to step S68. In step S68, it is determined whether or not the number of bits set to "0" in the page buffer is equal to or smaller than a set allowable value. When the determination result is affirmative, processing goes to step S65. When the determination result is negative, processing goes to step S69. In step S65, "Pass" is set in the status register, and in step S69, "Fail" is set in the status register. Next, in step S70, a Ready/Busy# signal is returned to a Ready status, and the write operation completes.

Figure 10:
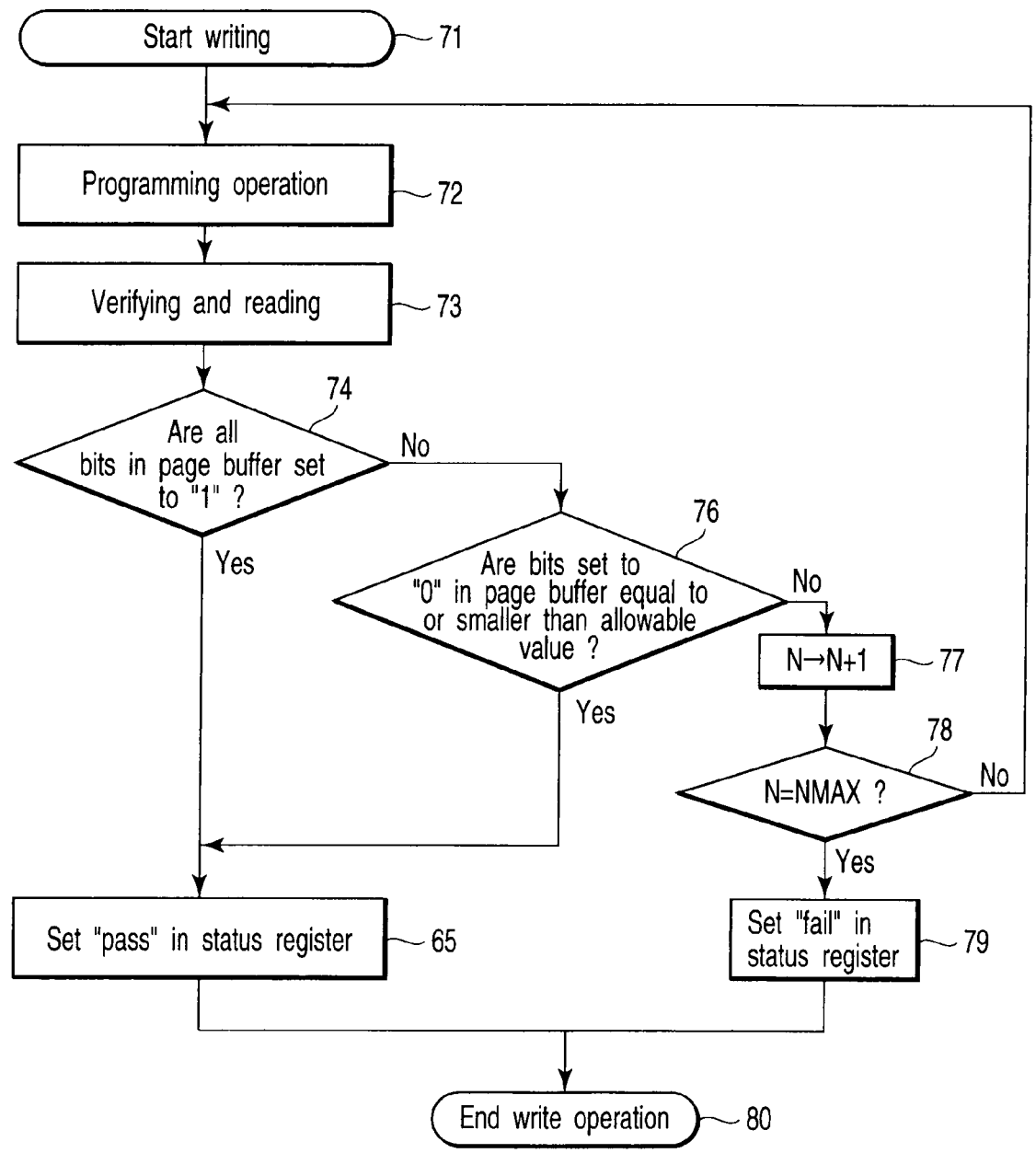
FIG. 10 is a flowchart showing procedures for detecting a write error in accordance with the sixth embodiment.

In this example, after the programming count has reached the maximum in the NAND flash memory, it is determined whether or not the number o bits set to "0" in the page buffer is equal to or smaller than an allowable number of bits. However, if the NAND flash memory is a circuit capable of processing determination of step S68 at a high speed, it is also possible to employ a flow of processing which is different from the above. This flow of processing will be described along the flowchart of FIG. 10.

First, in step S71, a write start operation is carried out, and a program count counter N is set to 1. Next, in step S72, a programming operation for transferring data from a page buffer to a memory cell array is carried out. Here, a program voltage Vpp of about 20 V is applied to a word line of an actually selected page. Next, in step S73, verifying and reading operations are carried out. Here, in a latch from among latches configuring the page buffer, the latch corresponding to the memory cell in which an electric charge has been sufficiently implanted, data is inverted from "0" to "1". Next, in step S74, it is determined whether or not all the data contained in the page buffer are set to "1". When the determination result is affirmative, processing goes to step S75. When the determination result is negative, processing goes to step S76. In step S76, it is determined whether or not the number of bits set to "0" in the page buffer is equal to or smaller than a set allowable value. When the determination result is affirmative, processing goes to step S75. When the determination result is negative, processing goes to step S77. In step S77, the programming count is incremented by 1. Next, in step S78, it is determined whether or not the programming count N has reached the set maximum value NMAX. When the determination result is negative, processing reverts to step S72. When the determination result is affirmative, processing goes to step S79. In step S75, "Pass" is set in the status resistor, and in step S79, "Fail" is set in the status register. Next, in step S70, a Ready/Busy# signal is returned to a Ready state, and the write operation completes. In this example, before the programming count in the NAND flash memory has reached the maximum, it is properly determined whether or not the number of bits set to "0" in the page buffer is equal to or smaller than an allowable number of bits. Therefore, if the number of bit lines in which a bit line leakage failure occurs is equal to or smaller than the allowable value, the programming count does not reach the maximum value.

Seventh Embodiment

The present embodiment describes write error detection in the case where a NAND flash memory in which a column failure has detected is provided with a pseudo-pass function.

While the sixth embodiment describes utilizing the pseudo-pass function of the NAND flash memory, a controller can obtain a pseudo-Pass result after an internal time-out has occurred in a write operation of the NAND flash memory (after the programming count has reached the maximum). Thus, for example, if a bit line leakage failure occurs, the maximum programming count has been reached every time the writing operation is carried out, and thus, the writing performance of the entire system utilizing the NAND flash memory is lowered. Accordingly, the present embodiment provides a method of, even in the case where a bit line leakage failure has occurred, obtaining a write Pass result without causing the lowered system performance.

Although described previously, in the NAND flash memory, during data writing, the data inputted from the controller is temporarily stored in the page buffer in the flash memory, and then, the writing operation is executed for the cell array which falls under the selected address at the same time. If an attempt is made to program "0" data in a memory cell of a column in which a bit line leakage failure occurs, a latch circuit is not forcibly inverted as described previously, and the programming operation is repeated up to the maximum count. Then, in the case where the controller writes data into the NAND flash memory, "1" is always written into the column in which a bit line leakage failure detected in advance occurs, regardless of a value of data which a host device attempts to essentially write. Namely, the essential data is masked by "1". In this case, data falling under a faulty address is masked by "1" regardless of a value of write data. Accordingly, it is presumed that correction is carried out by an ECC circuit of the controller during read. In the case where masking of a faulty address is carried out, there is proposed a method of carrying out masking by a bit unit "1", namely, carrying out masking by byte (or word) units "FFh" (or FFFFh"). It is possible to freely select any method depending on a unit of address information obtained by a system and a method for detecting the column failure. Further, when masking is carried out, there is proposed a case where the system inputs the data masked in advance in the NAND flash memory, and a method of transferring data to the flash memory, and then, masking data relating to the address on an internal page buffer of the NAND flash memory.

In addition, in the case where the NAND flash memory has a function for removing a specific bit line from a verification target during writing and during erasure, or alternatively, a function for always writing "1" or "FFh" into a memory cell of a specific column address in response to data writing, of course, the system utilizes this function, so that a similar object can be achieved.

Eighth Embodiment

The present embodiment describes a NAND flash memory having a function for always writing "1", or "FFh" in a memory cell of a specific column address.

Figure 11:
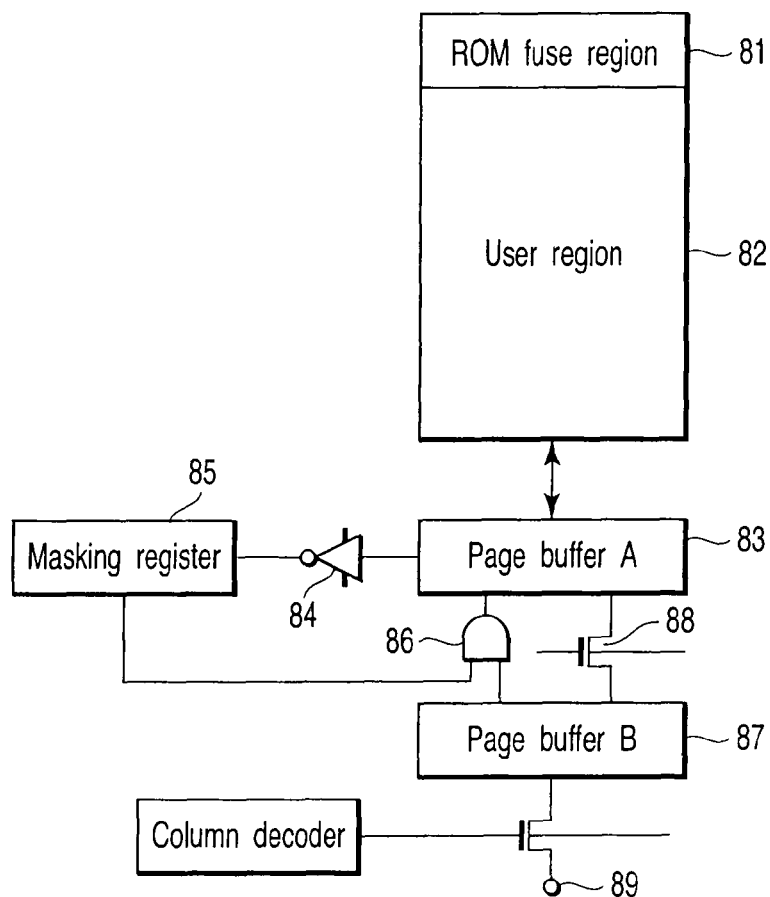
FIG. 11 is a block diagram of a NAND flash memory in accordance with an eighth embodiment of the present invention.

As shown in FIG. 11, a memory cell array of the NAND flash memory has a ROM fuse region 81 and a user region 82. The ROM fuse region 81 is part of a memory cell array, but is a region used to store a variety of data for controlling the NAND flash memory itself. A page buffer A83 is connected to the memory cell array via a bit line so as to write data from the page buffer A83 into a masking register 85 via a clocked inverter 84. The masking register 85 is designed to write data back to the page buffer A83 via one input of an OR circuit 86. The other input of the OR circuit 86 is connected to a page buffer B87. The page buffer B87 is connected to the page buffer A83 via a MOS transistor 88. When data is read from the memory cell array to the outside, data is transferred from the page buffer A83 to the page buffer B87 via the MOS transistor 88. The page buffer A83, the masking register 85, and the page buffer B87 each has a bit length which is equal to that of a page length of the memory cell array. The OR circuit 84 and the MOS transistor 86 are provided to be associated with this bit width. In the NAND flash memory, all the data set to "1" is described on a predetermined page of the ROM fuse region 81 in a state in which no bit line leakage failure occurs. When the NAND flash memory senses that power is supplied, a state machine in the NAND flash memory reads data from the predetermined page in the ROM fuse region 81, and stores the data obtained by inverting the data stored on the predetermined page, namely, all "0" in the masking register 85 via the page buffer A83 and the clocked inverter 84. With respect to data provided from the outside of the NAND flash memory to an I/O terminal 89, the data being captured in the page buffer B87, all the data contained in the masking register are set to "0" at this time, and therefore, is stored in the page buffer A83 as is. If a bit line leakage occurs in a column at one time point, with respect to the data stored in the masking register immediately after the NAND flash memory has been powered ON, the bit corresponding to the column is set 1, and the remaining data are set to "0". Then, during subsequent writing operation, the data stored from the outside in the page buffer B is masked in a data pattern of the masking register 85, and is stored in the page buffer A83. Namely, regardless of the data inputted from the outside to the I/O terminal 89, "1" data is always captured in the page buffer with respect to a column in which a bit line leakage has occurred, thus making it possible to avoid the programming count during writing operation reaching the maximum.

Further, when an attempt is made to improve reliability of the above circuit, all pages in the ROM fuse region may be selected by utilizing the bit line leakage detecting command described previously instead of reading only a page when power is supplied. In addition, a bit line leakage detecting command is executed for at least two different blocks, whereby a data pattern may be registered in the masking register by detecting that these two blocks match each other.

Figure 12:
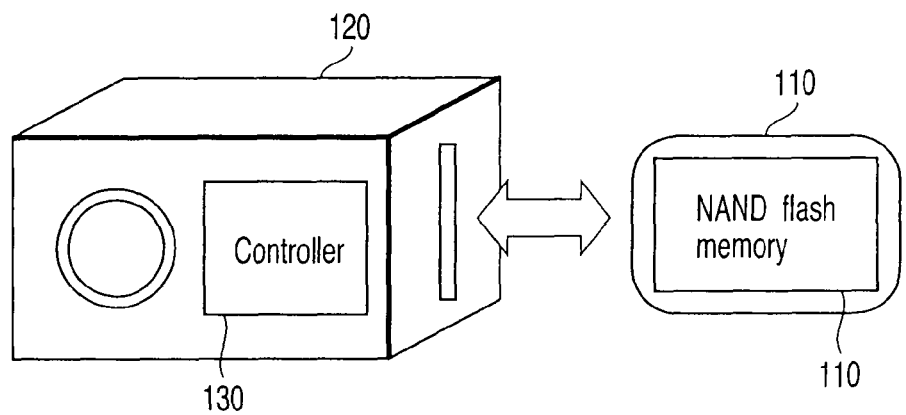
FIG. 12 is an overview of a system to which the present invention is applied.

The eighth embodiment of the present invention has described a case in which the NAND flash memory and controller are included in the same memory card, as shown in FIGS. 2 and 5. However, the present invention may include a controller 130 at the side of a host 120 such as a digital camera without including a controller in a memory card 110 which includes a NAND flash memory 100, as shown in FIG. 12.

In addition, in the case where a column failure is detected when plural items of error information in a plurality of blocks match each other and in the case where a memory cell array of a NAND flash memory consists of a plurality of planes, a bit line is not shared in different planes. Thus, a plurality of blocks must be selected in the same plane. If a faulty address register is provided, it is necessary to provide the register corresponding to each plane.

Further, the NAND flash memory in accordance with the embodiments has a wire width of for example, smaller than 0.1 microns, making it possible to ensure that its capacity is equal to or greater than 2 gigabits. In the case of such a NAND flash memory, it is possible to use a wire material which includes Cu (Copper), for example.

Further, in the above-described embodiments, there has been described the column failure detection by using a bit line leakage detecting command to detect a bit line leakage. Column failure includes the bit line leakage and bit line open. Although the bit line open detection is not described in the embodiments, the bit line open is detected by using a bit line open detecting command. Thus, the column failure detecting command is defined to mean both the bit line leakage and the bit line open detecting command.

In the foregoing, a method of detecting a column failure and a method of avoiding a write error which occurs due to such a column failure has been described by way of a NAND flash memory. However, this column failure is not limited to the NAND flash memory. The present invention can be applied to a nonvolatile semiconductor memory system using another nonvolatile memory.

In addition, the present invention is not limited to the embodiments. Various modifications can occur without deviating from the spirit of the invention at a stage at which the invention is carried out. Further, each of the embodiments includes inventions at various stages, and a variety of inventions can be excerpted in accordance with proper combinations in a plurality of constituent elements disclosed. For example, even if some of all the constituent elements presented in the embodiments are deleted, the constituent elements after deleted can be excerpted as inventions in the case where (at least one of) the programs described in the Background of the Invention section can be solved and in the case where (at least one of) the advantageous effects described in the Detailed Description of the Invention section can be attained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A memory system comprising:
   a NAND flash memory; and
   a controller configured to store write data in the NAND flash memory;
   wherein if a column failure has occurred during write operation, the controller specifies an address of a column of the NAND flash memory in which the column failure has occurred and the controller writes data of a first logic level to a memory cell which corresponds to the specified column address, regardless of data inputted from outside.

2. A memory system according to claim 1, wherein after the controller issues a data read command to the NAND flash memory, the controller carries out an error check and correction on data read from the NAND flash memory.

3. A memory system according to claim 1, wherein after the controller issues a register read command to the NAND flash memory, the controller detects a second logic level from a verification result read from a page buffer of the NAND flash memory.

4. A memory system according to claim 1, wherein after the controller issues a column failure detecting command to the NAND flash memory, the controller detects the first logic level or a second logic level from data read from a page buffer of the NAND flash memory.

5. A memory system according to claim 1, wherein the system is a card type memory system.

6. A memory system according to claim 1, wherein the controller issues a bit line open detecting command to the NAND flash memory for detecting the column failure.

7. A memory system according to claim 1, wherein the controller issues a bit line leak detecting command to the NAND flash memory for detecting the column failure.

8. A memory system according to claim 1, wherein when the memory system is turned on, the controller selects all of the pages of a region of a memory cell array of the NAND flash memory, which region stores data for controlling the NAND flash memory, by using bit line leak detection command.

9. A memory system according to claim 1, wherein when the memory system is turned on, the controller carries out leak detection for at least two different memory blocks of the NAND flash memory by using bit line leak detection command and stores a data pattern based on a coincidence of data of the memory blocks in an input data masking register.

* * * * *